(12) United States Patent
BeSerra et al.

(10) Patent No.: US 10,599,504 B1
(45) Date of Patent: Mar. 24, 2020

(54) DYNAMIC ADJUSTMENT OF REFRESH RATE

(71) Applicant: Amazon Technologies, Inc., Seattle, WA (US)

(72) Inventors: Christopher James BeSerra, Federal Way, WA (US); Gary S. Shankman, Olympia, WA (US); Gavin Akira Ebisuzaki, Bellevue, WA (US); Terry Lee Nissley, Lacey, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/746,544

(22) Filed: Jun. 22, 2015

(51) Int. Cl.
*G06F 11/07* (2006.01)
*G11C 11/406* (2006.01)
*G11C 29/44* (2006.01)
*G11C 29/04* (2006.01)
*G11C 29/52* (2006.01)
*G11C 29/00* (2006.01)
*G06F 11/10* (2006.01)

(52) U.S. Cl.
CPC ........ *G06F 11/076* (2013.01); *G06F 11/0727* (2013.01); *G06F 11/0793* (2013.01); *G11C 11/406* (2013.01); *G06F 11/106* (2013.01); *G11C 11/40615* (2013.01); *G11C 29/44* (2013.01); *G11C 29/52* (2013.01); *G11C 29/783* (2013.01); *G11C 2029/0411* (2013.01); *G11C 2211/4062* (2013.01)

(58) Field of Classification Search
CPC .......... G11C 11/406; G11C 2211/4062; G11C 29/52; G11C 11/401; G11C 16/3418; G11C 29/42; G11C 11/40622; G11C 29/08; G11C 13/0033; G11C 11/40615; G11C 11/40618; G11C 11/40611; G11C 2029/0411; G11C 29/44; G11C 29/783; G06F 11/106; G06F 11/1044; G06F 11/076; G06F 11/00; G06F 11/0793
USPC ........ 714/708, 704, 754, 767; 711/105, 106; 365/222
See application file for complete search history.

(56) References Cited

U.S. PATENT DOCUMENTS

| | | | |
|---|---|---|---|
| 7,233,538 B1 * | 6/2007 | Wu | G11C 11/406 365/222 |
| 7,275,130 B2 * | 9/2007 | Klein | G06F 1/3225 711/105 |
| 7,631,228 B2 * | 12/2009 | Brittain | G06F 11/076 365/222 |
| 9,318,182 B2 * | 4/2016 | Lovelace | G11C 11/40607 |
| 2003/0135794 A1 * | 7/2003 | Longwell | G06F 11/073 714/42 |
| 2004/0243886 A1 * | 12/2004 | Klein | G06F 1/3225 714/42 |
| 2005/0022065 A1 * | 1/2005 | Dixon | G06F 11/106 714/42 |
| 2008/0072116 A1 * | 3/2008 | Brittain | G06F 11/073 714/758 |

(Continued)

*Primary Examiner* — April Y Blair
*Assistant Examiner* — Sazzad Hossain
(74) *Attorney, Agent, or Firm* — Klarquist Sparkman, LLP

(57) ABSTRACT

The following description is directed to dynamically adjusting a refresh rate. In one example, a method can include determining a rate of memory errors, and dynamically adjusting a refresh rate of a memory based at least partially on the determined rate of memory errors.

17 Claims, 8 Drawing Sheets

(56) References Cited

U.S. PATENT DOCUMENTS

| | | | |
|---|---|---|---|
| 2008/0316931 A1* | 12/2008 | Qiu | H04L 41/0681 370/245 |
| 2011/0231697 A1* | 9/2011 | Berke | G06F 11/004 714/3 |
| 2012/0079314 A1* | 3/2012 | Kamath | G06F 11/0793 714/6.1 |
| 2012/0144106 A1* | 6/2012 | Bains | G11C 11/40611 711/106 |
| 2014/0043927 A1* | 2/2014 | Franceschini | G11C 29/023 365/201 |
| 2014/0211579 A1* | 7/2014 | Lovelace | G11C 11/40607 365/200 |
| 2015/0019913 A1* | 1/2015 | Singh | H04L 41/0631 714/37 |
| 2016/0155399 A1* | 6/2016 | Tripathi | G09G 3/3614 345/506 |

* cited by examiner

DYNAMIC ADJUSTMENT OF REFRESH RATE

BACKGROUND

Cloud computing is the use of computing resources (hardware and software) which are available in a remote location and accessible over a network, such as the Internet. In some arrangements, users are able to buy these computing resources (including storage and computing power) as a utility on demand. Cloud computing entrusts remote services with a user's data, software and computation. Use of virtual computing resources can provide a number of advantages including cost advantages and/or ability to adapt rapidly to changing computing resource needs.

Large computer systems, including cloud computing facilities can include many compute resources spread across one or more datacenters. In aggregate, the computer systems can consume a significant amount of power both for performing computations and for cooling the compute resources. The electricity used to run a computing facility can be a substantial cost of running the computing facility. Thus, the cloud service provider may desire to reduce the energy consumption of the computing resources to lower operational costs.

DETAILED DESCRIPTION

Figure 1:
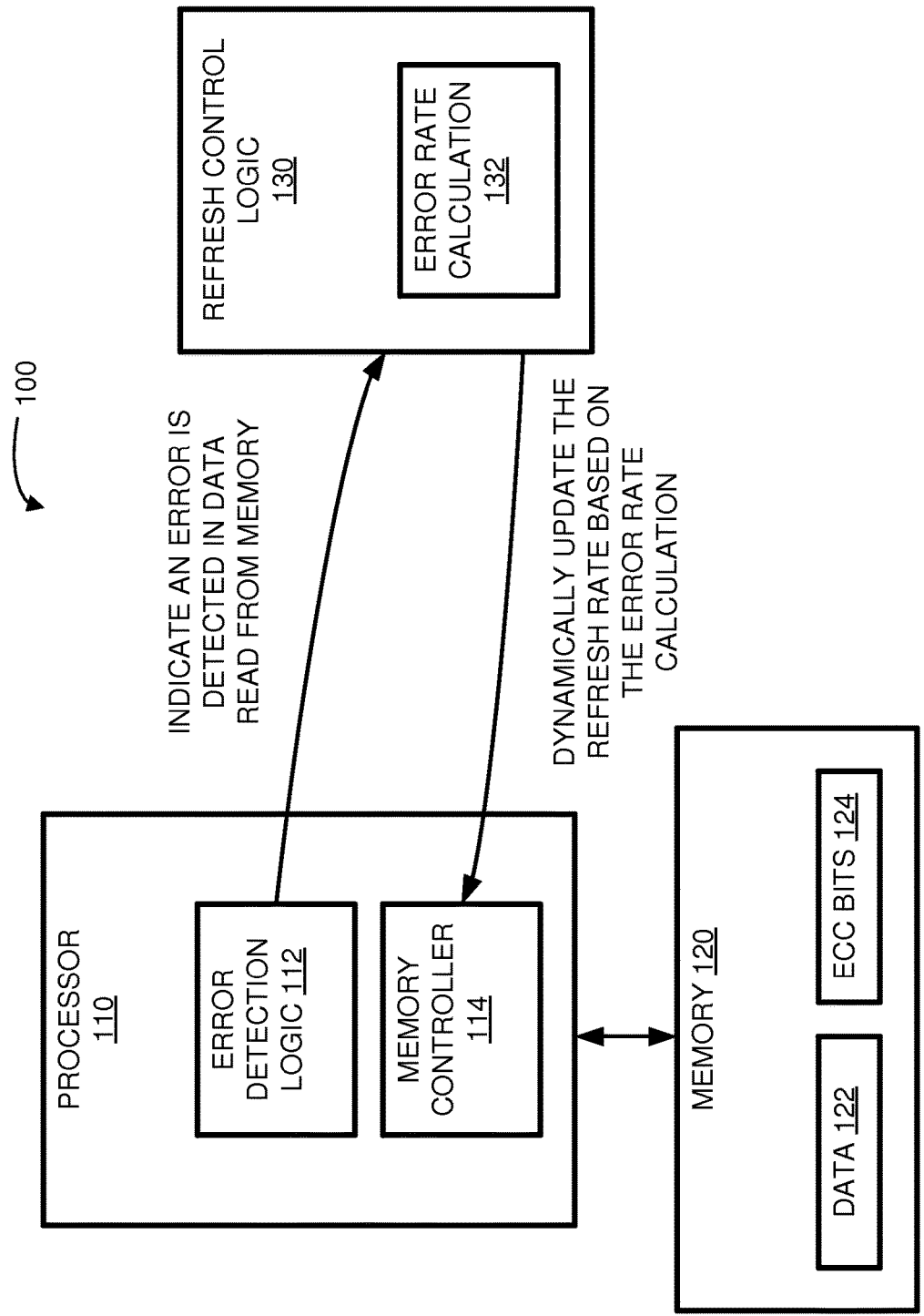
FIG. 1 is a system diagram showing an example computer system that dynamically adjusts a refresh rate based on an error rate of the memory.

Computer systems generally include a processor, and a memory hierarchy used for storing programs that are executing and the data associated with those programs. The main memory of the memory hierarchy is generally constructed from dynamic random access memory (DRAM). DRAM uses an array of memory cells to store the data in the DRAM, where each cell can store one bit of data. Computer systems typically store information in binary so each data bit can represent a zero or a one. An individual memory cell includes a capacitive element that is maintained in a charged or a discharged state, where the charged state can represent a one and the discharged state can represent a zero. A cell that is partially charged is in an indeterminate state meaning that the value could be interpreted as either a zero or a one. The storage abilities of the memory cell are imperfect, and over time the cell leaks charge so that the cell will slowly discharge and the information will fade unless the cell's charge is refreshed periodically.

Memory refresh is the process of periodically reading information from one or more memory locations and then rewriting the read information to the same locations so that the information is retained. Typically, a memory controller of the computer system will perform automated memory refresh operations without interaction from the processor. The rate at which each location is refreshed is the refresh rate. Each manufacturer of the memory will specify a suggested base or default refresh rate (e.g., once every 64 milliseconds) for the memory. However, in some cases, the suggested base refresh rate (the 1× refresh rate) may not be sufficient to retain the information in the memory because one or more of the memory cells may discharge more rapidly than expected. The rate that a memory cell discharges is a function of the cell design, environmental conditions (such as alpha particle emissions), the history of operations on the cell and to neighboring cells, and other factors.

Row hammer is a technique that has been used to corrupt the contents of a memory. For example, row hammer can be used in a Denial of Service attack or in conjunction with other malicious behavior. A row hammer attack includes repeatedly accessing the same memory rows numerous times at a rate faster than the refresh rate. Row hammer exploits the property that each time a row of the memory is accessed, the cells of neighboring rows can interact electrically with the row being accessed. For example, charges can be shared between the row of the memory being read and the cells in neighboring rows. The base refresh rate accounts for the interaction during typical access patterns so that the memory will maintain its information. However, the row hammer access patterns can create an environment beyond the manufacturer's expectations and the contents of the targeted cells can be corrupted. If the corruption cannot be corrected, then the computer system may be rebooted (e.g., power-down and restart) to prevent further corruption of data. During the reboot, the computer system is unavailable to users.

Some memory errors are correctable, such as when error correcting codes (ECC) are used to protect the data. A common ECC code used to protect computer memory is a Hamming code for correcting a single-bit error and detecting a double-bit error. The data stored on a computer memory is organized into words having multiple bits per word, such as 32, 64, or 128 bits per word. When the data word is to be written to memory, ECC bits can be calculated for the data word, and the ECC bits can be stored in association with the data word so that the data word can be protected by the ECC bits. When the data word and ECC bits are read from memory, the data word can be verified using the ECC bits. In particular, a single-bit error of the data word can be corrected, and double-bit errors can be detected.

Memory scrubbing is the process of periodically reading information from one or more memory locations, checking for errors and performing error correction for single bit errors, and then rewriting the read information to the same locations so that the information is retained. If a system designer is concerned about a potentially high error rate, the designer can specify that a patrol scrub be automatically performed in addition to the memory refresh operations. The frequency of the patrol scrub can be specified by setting a patrol scrub rate. By performing the patrol scrub, single-bit errors can potentially be detected and corrected before a second bit of the word is corrupted.

A small number of correctable errors (such as 10 errors in a 24-hour span) can be expected in a typical computer system. A service provider operating a datacenter may monitor the number of correctable errors that a system observes. The provider may set the refresh rate of the compute resources so that the number of correctable errors does not exceed a threshold number of errors. For example, increasing the refresh rate can reduce the error rate because each cell has less time to leak and interact with neighboring cells between refreshes. The refresh rate and the patrol scrub rate (if patrol scrub is used) can be set by the basic input output system (BIOS) as part of an initialization sequence when the computer system is powered on. A provider may set the refresh rate based on the memory manufacturer's recommendations, experience with past events, and in-line with future threats. For example, if the provider expects denial of service attacks utilizing row hammer techniques, the provider may increase the refresh rate of the memory of the computer systems to twice the default rate (to a 2× refresh rate) so that row hammer will be ineffective. The provider may also perform frequent patrol scrubs (such as once an hour). However, increasing the refresh rate and the patrol scrub rate can decrease the performance of the system (such as when refresh and scrub operations delay other computations) and increase the power used by the computing systems, which can increase the operational costs of the provider.

As described herein, the error rate can be potentially reduced in a power-efficient way by dynamically adjusting the refresh rate and the patrol scrub rate of the memory based on a detected error rate. For example, a computer system can be initialized to use the manufacturer's default refresh rate (1×) and infrequent patrol scrubs (e.g., one scrub per 24-hour interval) to reduce power for these overhead tasks. The frequency of errors detected within the system can be monitored, and the system can be adapted to perform more reliably if the frequency of errors exceeds the system provider's metrics. If the frequency of errors spikes, the system can send an alert to a management system indicating that a potential attack may be underway. Each error can be logged and administrator can analyze the log in conjunction with other system performance data to determine if additional actions are desired.

The refresh rate and the patrol scrub rate can automatically be increased when the number of correctable errors exceeds one or more thresholds. For example, the threshold can be set to one error within two hours. If the number of errors exceeds the threshold, the refresh rate can be dynamically increased from the default 1× rate to a 2× rate. The change to the refresh rate can occur while the computer system is running. Notifications about detected errors can be logged by sending an error message to a central management server noting the server computer, the dual in-line memory module (DIMM) location, and the memory address. The error logging can be handled by a baseboard management controller (BMC) configured to generate a platform event filter (PEF) action, sending a Simple Network Management Protocol (SNMP) message to the management server over a management or console network.

If the number of errors continue to exceed the threshold, the patrol scrub interval can be decreased from the 24 hour default interval to a two hour interval. Additional reductions can occur if the number of errors continue to exceed the threshold, such as reducing the interval to one hour, and then to a minimum time between scrub requests. Any time the patrol scrub interval is changed, an error message can be sent to the management server notifying it of the change in the patrol scrub interval. Thus, security, investigative, or repair actions can be performed.

If the number of errors begin to decrease below the threshold, the patrol scrub interval and the refresh rate interval can be increased by incrementally reversing the changes above. Thus, additional protection of the memory contents can be provided when the error rate is higher than desired and power consumption can be reduced when the error rate is within a desired or expected range.

FIG. 1 is a system diagram showing an example computer system 100 that dynamically adjusts a refresh rate based on an error rate of a memory 120. The computer system 100 can include a processor 110, the memory 120, and refresh control logic 130. The processor 110 can be in communication with the memory 120 and the refresh control logic 130. For example, the processor 110 can write information to the memory 120 so that the information will be stored and maintained within the memory 120. As another example, the processor 110 can read from the memory 120 to retrieve the information stored therein.

The reads and writes from the processor 110 can be managed by a memory controller 114. For example, the processor 110 can access memory using one set of interface signals that are communicated to the memory controller 114, and the memory controller 114 can generate the interface signals to one or more different types of memory (such as DRAM, static random access memory (SRAM), read-only memory (ROM), Flash memory, and so forth) of the computer system 100. The memory controller 114 can also combine memory operations (such as reads from and/or writes to sequential locations) so that access to the memory is more efficient. The memory controller 114 can perform background tasks, such as refresh and patrol scrubbing, without direct control from the processor 110. The memory controller 114 can be integrated on the same die as the processor 110 (as illustrated) or the memory controller 114 can be located on a separate integrated circuit.

The memory controller 114 or other logic of the processor 110 can generate ECC bits for each data word that is written to the memory 120. For example, the information written to the memory 120 can be protected using a (72, 64) Hamming code. When a (72, 64) Hamming code is used, 72 total bits are used to store a 64 bit data word because an additional 8 bits are used for the ECC bits. In other words, a 72-bit code word can be generated for each 64-bit data word. The family of Hamming codes are block codes, which encode each data word independently of other data words. Because the memory 120 can be randomly accessed, block codes may be more desirable than convolutional codes for generating the ECC bits. However, convolutional codes can be used to protect the information when multi-word access patterns are used. ECC generation logic (not shown) within the memory controller 114 can generate or encode the ECC bits for each word written to the memory 120.

The memory 120 can be DRAM or another type of memory that is refreshed to maintain the information in the memory. The memory 120 can include storage for data 122 and ECC bits 124. For example, the data 122 can be arranged in words where each word is individually addressable. One or more of the ECC bits 124 can be associated with each word so that a data word corresponding to a given address can be potentially corrected. For example, the memory 120 can be arranged 72-bit words, where 64 bits are for the data and 8 bits are for the ECC bits. The memory 120 can be integrated on the same die as the processor 110, located externally (off-chip), or a combination thereof. For example, the memory 120 can be located in multiple memory chips mounted on one or more DIMMs that are connected to a printed circuit board of the computer system 100.

Error detection logic 112 can be used to indicate that an error is detected in data read from the memory 120. In particular, the error detection logic 112 can verify whether a valid code word (the code word is the combination of data and ECC bits) is read from the memory 120. Using the (72, 64) Hamming code as an example, a 64-bit data word is encoded as a 72-bit code word. A 72-bit word can have $2^{72}$ different values, but only $2^{64}$ values are legal code words. Thus, if the code word that is read has a value that is different from one of the legal $2^{64}$ values, an error has occurred. For example, one or more of the bits could have "flipped" (changed from a one to zero or vice versa) in the time between when the bit was written and when the bit was read because of a manufacturing defect (a hard error), a soft error, excessive leakage, or electrical interactions due to access patterns of the memory 120. The error detection logic 112 can determine that an error is present when the code word read from the memory 120 is not a legal code word. The error detection logic 112 can also determine whether the error(s) are correctable. In one embodiment, single-bit errors can be detected and corrected and double-bit errors can be detected. In alternative embodiments, more errors can be detected and corrected at the cost of using more ECC bits (and a different encoding algorithm). Error correction logic (not shown) can be used to correct the data read from the memory 120 when the error is correctable. In one embodiment, the error detection logic 112 can assert an interrupt when an error is detected.

Refresh control logic 130 can receive the indication that an error is detected. For example, the refresh control logic 130 can be coded in an interrupt handler that executes on the processor 110 and/or on a BMC. The refresh control logic 130 can track the occurrence and timing of errors that have occurred within a pre-defined time interval so that an error rate can be calculated. For example, an error rate calculation module 132 can be used to track the error rate. As a specific example, time-stamps associated with the errors can be logged to a queue, and times older than the tracking interval can be removed from the queue. The number of entries in the queue will be the number of errors that have occurred during the tracking interval. Thus, the error rate can be calculated as the number of errors occurring within a given amount of time. Various other methods may be used to calculate the error rate as a measure of the number of errors per unit of time.

The calculated error rate can be compared to a desired or threshold error rate and the refresh rate can potentially be adjusted based on the calculated error rate. For example, if the calculated error rate is less than or equal to the threshold error rate, then the current refresh rate and patrol scrub rate can be maintained. However, if the calculated error rate is greater than the threshold error rate, then the current refresh rate and/or patrol scrub rate can be dynamically updated. For example, the refresh control logic 130 can update or initiate an update to one or more registers of the memory controller 114 so that the refresh rate and/or patrol scrub rate are adjusted. The update can occur while the processor 110 is operating and without rebooting the processor 110 so that services provided by the computer system 100 are not interrupted.

Figure 2:
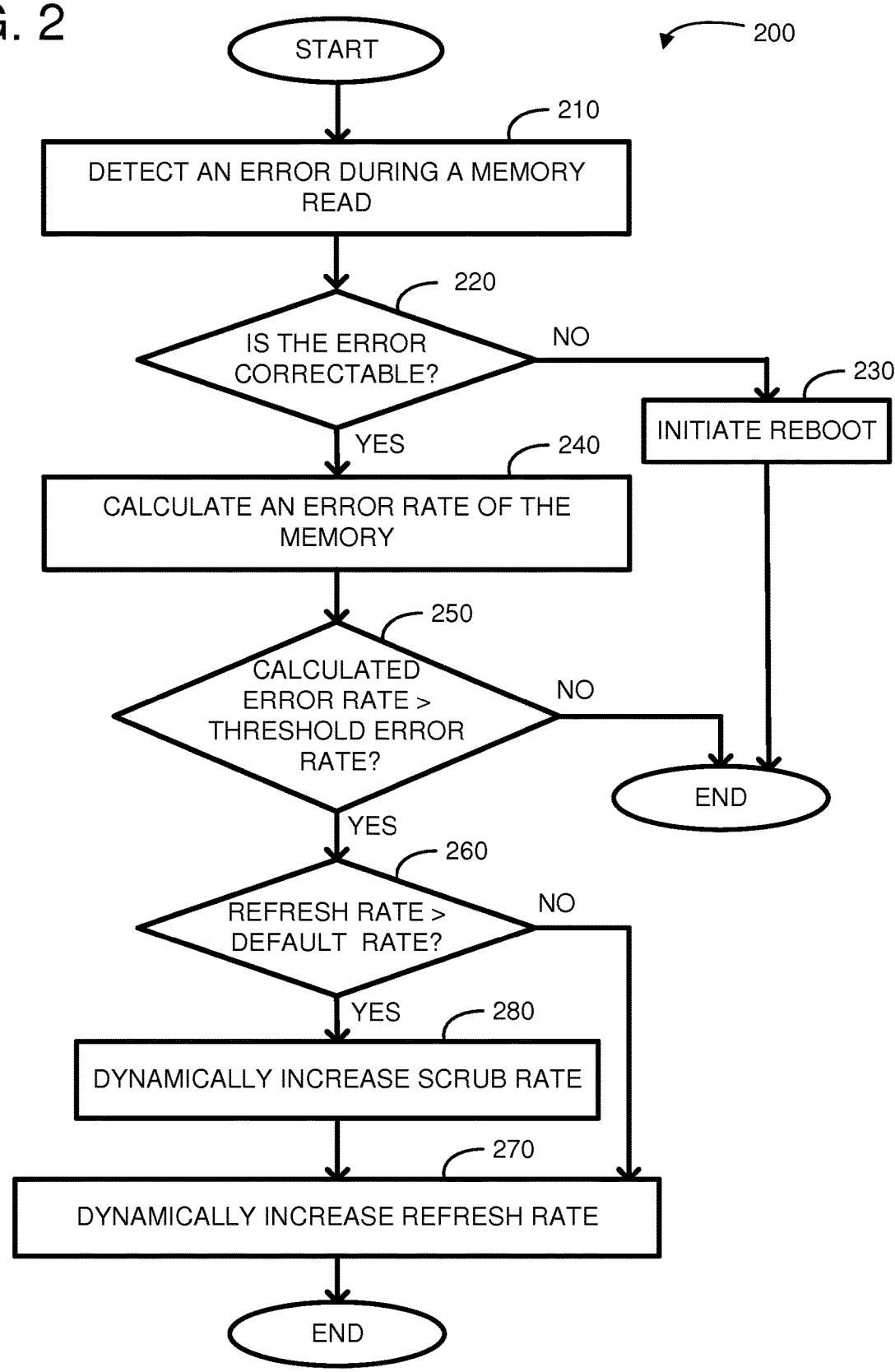
FIGS. 2 and 3 are flow diagrams of example methods for adjusting the refresh rate based on the error rate of the memory.
Figure 3:
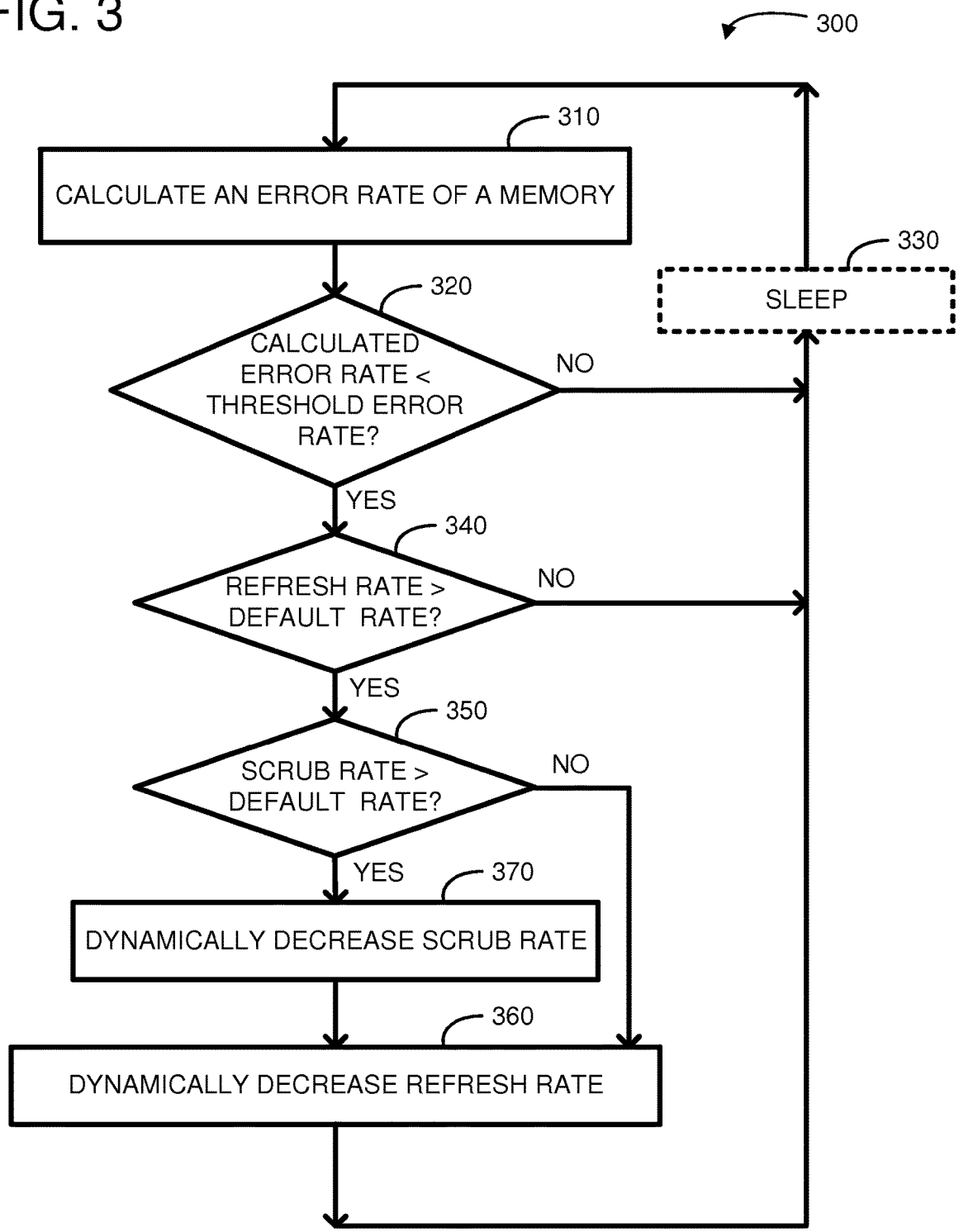

FIGS. 2 and 3 are flow diagrams of example methods for adjusting the refresh rate based on the error rate of the memory. FIG. 2 is a flow diagram of an example method 200 for determining whether to increase the refresh rate based on the error rate of the memory. FIG. 3 is a flow diagram of an example method 300 for determining whether to decrease the refresh rate based on the error rate of the memory.

Turning to FIG. 2, at 210, an error can be detected during a memory read. For example, the error detection logic 112 can detect whether the error occurred by determining whether the code word including the data and ECC bits matches a legal code word generated by the ECC algorithm. If the code word that is read is not a legal code word, then an error has occurred. The error can be correctable (e.g., a single-bit error) or uncorrectable (e.g., a double-bit error). The memory read can occur during normal operation of the processor 110, such as when a program executing on the processor 110 is being fetched or is reading from memory. Additionally, the memory read can occur during a memory scrub operation that is managed by the memory controller 114 since a memory scrub operation includes performing ECC checks on words read from memory.

At 220, if the error is not correctable, the method 200 can transition to 230, where a reboot can be initiated. Initiating a reboot can include requesting a reboot through an operating system application programming interface (API), raising an interrupt that will cause a reboot, interrupting power to the processor 110 (such as by opening a relay), or other action designed to power down and restart (cycle power to) the processor 110. By rebooting or powering down the processor when an uncorrectable error is detected, data corruption may be potentially reduced or prevented. On the other hand, if the error is correctable, the method 200 can transition from 220 to 240.

At 240, an error rate of the memory can be calculated. One or more error rates can be calculated over one or more different time intervals. For example, different error rates can be calculated over different pre-defined time intervals, such as 24, 12, two, or one hour intervals. As another example, the error rate can be calculated from the more recent of a 24-hour interval or the last update to the refresh rate and/or patrol scrub rate. Yet another error rate can be calculated from the last memory scrub. Calculating multiple error rates over different time intervals may be useful for separating out short-term trends from longer-term trends and for analyzing the effect of various actions, for example.

At 250, the calculated error rate can be compared to a threshold error rate. For example, the threshold error rate can be ten errors in a 24-hour interval. As described above, multiple different error rates can be calculated and each of the calculated error rates can be compared to a respective threshold. If the calculated error rate is less than or equal to the threshold error rate, the method 200 can end. However, if the calculated error rate exceeds the threshold error rate, then the refresh rate and/or the scrub rate can be progressively increased so that more protection can be provided for the memory.

At 260, the refresh rate can be compared to the default (1×) refresh rate. The default refresh rate can be the manufacturer's recommended setting for the refresh rate. For example, the default rate can be the lowest power refresh rate setting. When the refresh rate is set at the default rate, it can generally be implied that the rate of memory errors prior to this point have been within the threshold rate. Thus, memory protections can be ramped up in successive stages so that the power consumed by refreshing and scrubbing is reduced as compared to switching directly to the most protective configuration. For example, during the first stage, only the refresh rate can be increased. During the second stage, both the refresh rate and the scrub rate can be increased. Multiple stages can be enabled, until a maximum protection scheme is achieved. For example, if the refresh rate is equal to the default rate (indicating the first stage), only the refresh rate can be dynamically increased at 270. Alternatively, if the refresh rate is greater than the default rate (indicating a later stage), both the scrub rate and the refresh rate can be dynamically increased at 280 and 270, respectively. At each stage, the refresh rate and the scrub rate can be increased in multiples, such as 1×, 2×, 3×, and so forth or by more incremental amounts, such as by direct programming of the refresh interval in milliseconds, for example. The rate can be increased linearly, or otherwise. For example, the scrub rate can be increased from once every 24 hours, to once every two hours, to once every one hour, to a maximum scrub rate.

It should be understood that the method 200 is merely one example of dynamically updating the refresh rate based on the rate of memory errors detected, and many variations are possible. As one example, a scrub of the entire memory can be performed any time that the calculated error rate is greater than the threshold error rate. By scrubbing the memory as part of a procedure to update the refresh rate, any single-bit errors present in the memory that have not yet been detected, can be potentially corrected before they become double-bit errors (e.g., before another bit of the data word gets flipped). Furthermore, newly detected memory errors can be assumed to have occurred after the memory scrub and with the latest refresh rate in place. Thus, the effect of updating the refresh rate can be more easily ascertained.

As another example, a rate of increase in the error rate can be calculated and compared to a threshold rate of increase. For example, the rate of increase may show trends more readily than the error rate alone. A sudden spike in the error rate, as shown by a large increase in the error rate, may indicate that an attack has begun and memory protections can be ramped up more quickly than in the example method 200. The rate of increase in the error rate can be monitored in addition to the error rate.

In order to reduce the power devoted to refreshing and scrubbing, the rate of refreshing and scrubbing can be reduced when the error rates are reduced. FIG. 3 is a flow diagram of an example method 300 for determining whether to decrease the refresh rate based on the error rate of the memory. At 310, an error rate of a memory can be calculated. The error rate can be calculated when a sleep timer expires, and/or when an error is detected, for example. A timer may be used because when the refresh rate and the patrol scrub rate are high, errors may become infrequent (e.g., the error rate is low). Thus, calculating the error rate at a regular interval (such as once an hour) may enable the refresh rate and patrol scrub rate to be adjusted in a more responsive manner than waiting for an error to occur. As described above, error rates corresponding to different time intervals can be calculated, so that they can be compared to different respective thresholds.

At 320, the calculated error rate can be compared to a threshold error rate. The threshold error rate for decreasing the memory protection can be different from the threshold error rate for increasing the memory protection. For example, the threshold error rate for decreasing the memory protection can be less than the threshold error rate for increasing the memory protection to provide a hysteresis effect. If the calculated error rate is greater than or equal to the threshold error rate, then it may be desirable to maintain the current memory protection. Thus, the method 300 can sleep (330) until the next time that the error rate is to be calculated. However, if the calculated error rate is less than the threshold error rate, then it may be desirable to reduce the current memory protection to potentially reduce power consumption. At 340, the refresh rate can be compared to the default refresh rate. If the refresh rate is already equal to the default refresh rate, then no further reductions in the refresh rate can occur and the method 300 can sleep (330). However, if the refresh rate is greater than the default refresh rate, then the refresh rate, and potentially the scrub rate, can be reduced.

At 350, the scrub rate can be compared to the default scrub rate. If the scrub rate is equal to the default scrub rate, then, at 360, the refresh rate can be dynamically decreased. If the scrub rate exceeds the default scrub rate, then the scrub rate and the refresh rate can be dynamically decreased at 370 and 360, respectively. In this manner, the memory protections can be reduced in the same order as they were increased. Alternatively, the memory protections can be reduced faster or slower than when they were increased. For example, a rate of decrease of the memory errors can be used to determine how much to decrease the memory protections. After 360, the method 300 can sleep at 330 and then repeat beginning at 310.

Figure 4:
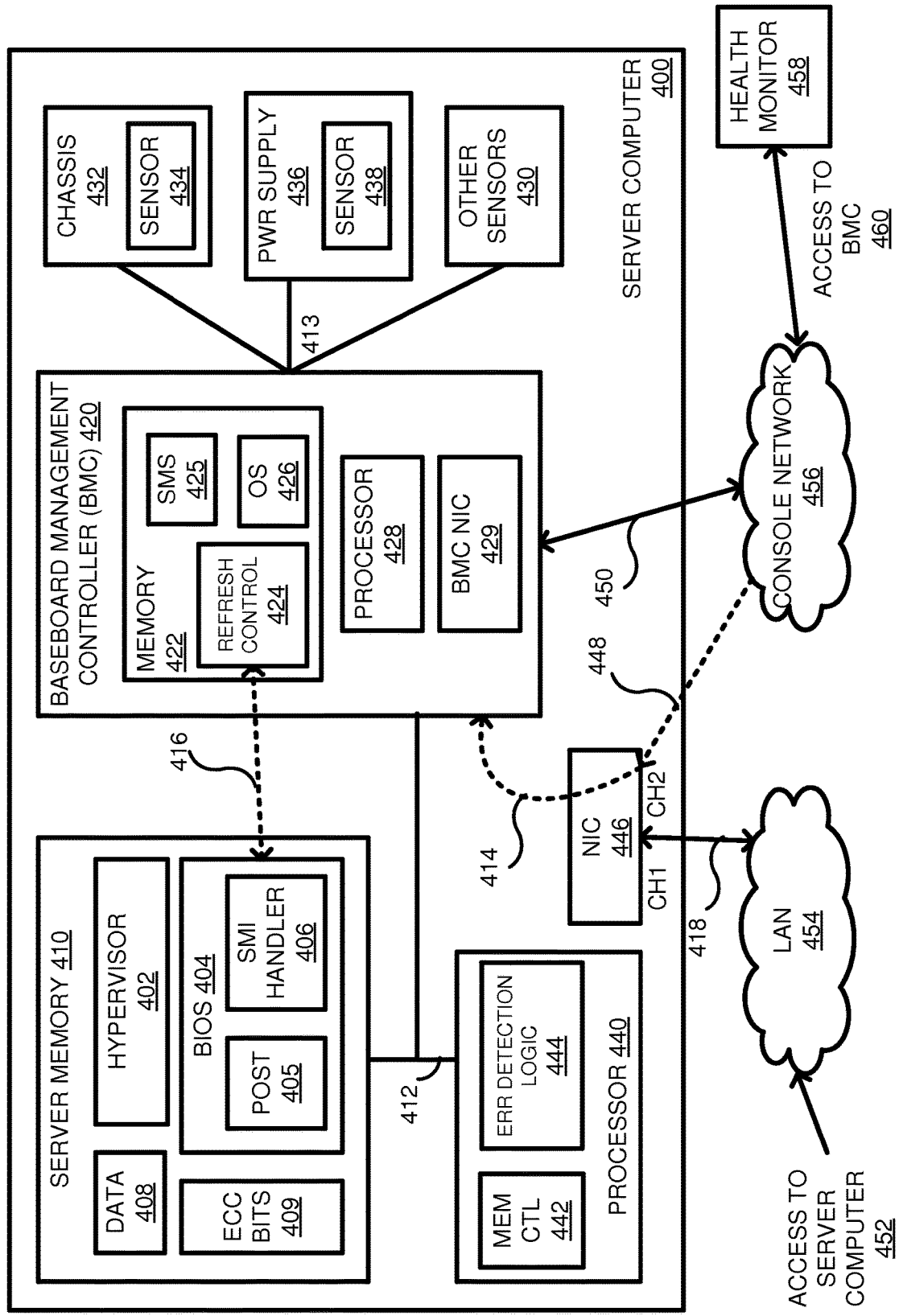
FIG. 4 is a system diagram showing an example computer system that dynamically adjusts a refresh rate based on an error rate of the memory.

FIG. 4 is a system diagram showing an example computer system that dynamically adjusts a refresh rate based on an error rate of the memory. Referring to FIG. 4, there is illustrated a server computer 400, which supports dynamically adjusting a refresh rate using a BMC.

The server computer 400 may operate in a virtual computing environment and may perform functionalities related to the virtual computing environment as described in greater detail herein below in reference to FIGS. 5-7. For example, the server computer 400 may be configured to provide computing resources for executing software instances using a hypervisor, such as the hypervisor 402. In this regard, the server computer 400 may comprise a processor 440, server memory 410, a network interface card (NIC) 446, a BMC 420, chassis 432, power supply 436 and other sensors 440. Even though FIG. 4 illustrates the server computer to comprise only the above listed modules, such illustration in FIG. 4 is only for simplicity and the present disclosure may not be limited in this regard.

The processor 440 can include an integrated memory controller 442 and error detection logic 440. The memory controller 442 and error detection logic 440 may include similar functionality to the memory controller 114 and error detection logic 112. In particular, the memory controller 442 can generate the interface signals to one or more different types of memory and can perform background tasks, such as refresh and patrol scrubbing. The memory controller 442 can include registers that can control the refresh rate and the patrol scrub rate. The error detection logic 440 can be used to indicate whether an error is detected in data read from the memory 410. The error detection logic 440 can determine whether the error is correctable or uncorrectable.

The server memory 410 may include similar functionality to the memory 120. For example, the server memory 120 can include DRAM having storage space for data 408 and for ECC bits 409. Additionally, the memory 410 may also be used by the processor 440 to run one or more programs, such as the hypervisor 402 and a basic input output system (BIOS). For example, the BIOS 404 can be firmware used to initialize the processor 440 and other hardware during the booting process (power-on startup) and to act as an intermediary software layer between the hardware and higher levels of software. In particular, the BIOS 404 can include a boot loader (not shown) to load an operating system (such as the hypervisor 402) from a mass storage device (not shown).

The BIOS 404 can include code for executing a power-on self-test (POST 405). The POST 405 can check, identify, and initialize system devices such as the processor 440, memory controller 442, RAM, system timers, interrupt and DMA controllers and other parts of the chipset, video display card, keyboard, hard disk drive, optical disc drive and other basic hardware. As a specific example, the POST 405 can set the default refresh rate and default power scrub rate during system initialization. The POST 405 can initialize an interrupt table that references different interrupt service routines, such as a system management interrupt (SMI) handler 406.

The BIOS 404 can include various services that can be called using hardware and software interrupts that reference the interrupt table. For example, the SMI handler 406 can be called by asserting an SMI pin of the processor 440, such as by the error detection logic 444 when an error is detected. The SMI handler code can be used to perform methods (such as methods 200 and/or 300) to dynamically adjust the refresh rate based on the memory error rate. In particular, a memory error can be detected by the error detection logic 444 which can assert the SMI pin, causing the SMI handler 406 to be invoked. The SMI handler can determine that the error detection logic 444 asserted the interrupt and execute a refresh control routine. The refresh control routine can calculate an error rate, determine if the calculated error rate exceeds a threshold rate, and dynamically adjust the refresh rate and/or patrol scrub rate accordingly. Specifically, the refresh rate and/or patrol scrub rate can be adjusted by writing the control registers of the memory controller 442. These registers can be written while the processor 440 is operating without performing a reboot of the processor 440.

The BMC 420 may comprise suitable logic, circuitry, interfaces, and/or code and may be used to perform system management functionalities related to the server computer 400. For example, the BMC 420 may implement an intelligent platform management interface (IPMI) (or another type of a management interface) for out-of-band management of various components within the server computer 400 as well as monitoring the server's operation.

For example, the BMC 420 may monitor system "health" parameters such as power supply status, cooling fan speed, chassis temperature, server OS status, and so forth, using one or more sensors (e.g., sensor 434 within the chassis 432, sensor 438 within the power supply 436, and/or other sensors 430). The BMC 420 may be implemented as an internal peripheral device within the server computer 400 (e.g., an embedded microcontroller), with its own processor 428 and memory 422. Alternatively, the BMC can be implemented as an external peripheral device, such that it is coupled to the server computer 400 through a cable. The BMC processor 428 may execute the BMC operating system 426 (which is different from and independent of the hypervisor 402) from the memory 422.

The BMC processor 428 may also execute other programs from the memory 422, such as refresh control logic 424, system management software 425, and/or patch software (not shown). The refresh control logic 424 can include software to carry out one or more methods for dynamically adjusting the refresh rate and/or scrub rate (such as methods 200 and 300). For example, the refresh control logic 424 can periodically calculate the memory error rate (such as at the expiration of a timer and/or when a memory error is detected) and determine whether the calculated error rate is less than a threshold amount. If the calculated error rate is less than a threshold amount, the refresh control logic 424 can cause the refresh rate and/or scrub rate to be dynamically decreased. For example, the refresh control logic 424 can communicate with the SMI handler 406 via a mailbox or handshake 416 so that the SMI routines can be used to write to the control registers of the memory controller 442. The control registers are configured to control the refresh rate and/or the patrol scrub rate.

The system management software (SMS) 425 may be used by the BMC processor 428 to receive and process data related to the BMC's system management functionalities (e.g., monitoring of the system "health" parameters), and provide corresponding alerts and/or notifications (e.g., to the health monitoring service 458). For example, the BMC processor 428 may provide the health monitoring service 458 with notifications via the console network 456, if any of the parameters do not stay within limits, indicating a potential problem with the monitored subsystem/module. As another example, the BMC processor 428 may provide the health monitoring service 458 with notifications regarding the status of the memory 410. In particular, notifications can be sent when the refresh rate and/or scrub rate are increased or decreased, or when memory errors are detected. As a specific example, the BMC 420 can generate a PEF action, sending a SNMP message to the health monitoring service 458 over the console network 456. The health monitoring service 458 can aggregate and analyze the health information coming from the different server computers and can potentially detect trends within the fleet. For example, a high rate of memory errors across multiple servers may indicate that a denial of service attack utilizing row hammer is underway.

Communication within the server computer 400 may take place using one or more buses, such as bus 412 and bus 413. The buses 412, 413 may combine one or more different bus types, such as a system bus, a peripheral bus and so forth. In an example embodiment, the BMC 420 may be implemented as a PCI card coupled as a peripheral to the server computer 400 using a PCI express interconnect. Additionally, the server computer 400 may comprise a NIC 446, which may comprise suitable logic, circuitry, interfaces, and/or code and may be operable to provide access to the server computer 400 via the communication network (e.g., a local area network, or LAN) 454. Access 452 to the server computer 400 via the LAN 454 and communication path 418 (e.g., wired and/or wireless) may be secured by a first user name (UN1) and a first password (PW1).

The BMC 420 may comprise its own NIC 429, which may be used (e.g., by the health monitoring service 258 or a system administrator) for accessing the BMC 420 as well as any other components within the server computer 400 that the BMC 420 provides access to. More specifically, the system administrator may access and communicate with the BMC 420 via the console network 456 and communication path 450 (e.g., wired and/or wireless). Access 460 to the BMC 420 may be secured by a second user name (UN2) and a second password (PW2). The console network 456 may be a wired and/or wireless management network that communicatively couples a plurality of BMCs (e.g., as illustrated in FIG. 5) and provides secured (e.g., password-protected) access (e.g., to a network administrator or service) for purposes of accessing and communicating with the BMCs (e.g., BMC 420). Example communications using the console network 456 include receiving system notifications or alerts from the BMC 420, dispatching (or uploading) software (e.g., patching software) to the BMC memory 422, communicating information about the state of the memory as provided by the refresh control code 424, and other network management communications.

In an example embodiment, the BMC 420 may be adapted to communicate with the management console network 456 using the NIC 446 of the server computer 400. For example, the NIC 446 may implement two separate communication channels (e.g., CH1 and CH2), with CH1 being used by the LAN 454 for communications with the server computer 400, and CH2 being used for dedicated communication between the console network 456 and the BMC 420 using the communication paths 448 and 414. Regardless of whether a single (e.g., dual-channel) NIC 446 is used within the server computer 400, or the BMC 420 uses its own NIC 429, access to memory 410 may be achieved either via two separate communication networks (e.g., LAN 454 and console network 456), which access (452 and 460) may be secured (e.g., by passwords PW1 and PW2, respectively). In an example implementation of the disclosure, the networks 454 and 456 may be part of the same network (e.g., only one network may be used in place of two separate networks 454 and 456). In such implementation, communications with the server computer 400 and the BMC 420 may take place using the NIC 446. In any of the embodiments, a separate IP address can be used for each of the server computer 400 and the BMC 420. Additionally, the communication networks 454 and 456 may comprise one or more local area networks (LANs) or one or more wireless LANs (WLANs) consisting of a few computers, or it can include many computers distributed over geographic regions. Additionally, the communication networks 454 and 456 may each include a combination of any other types of wired and/or wireless networks and/or the Internet.

Figure 5:
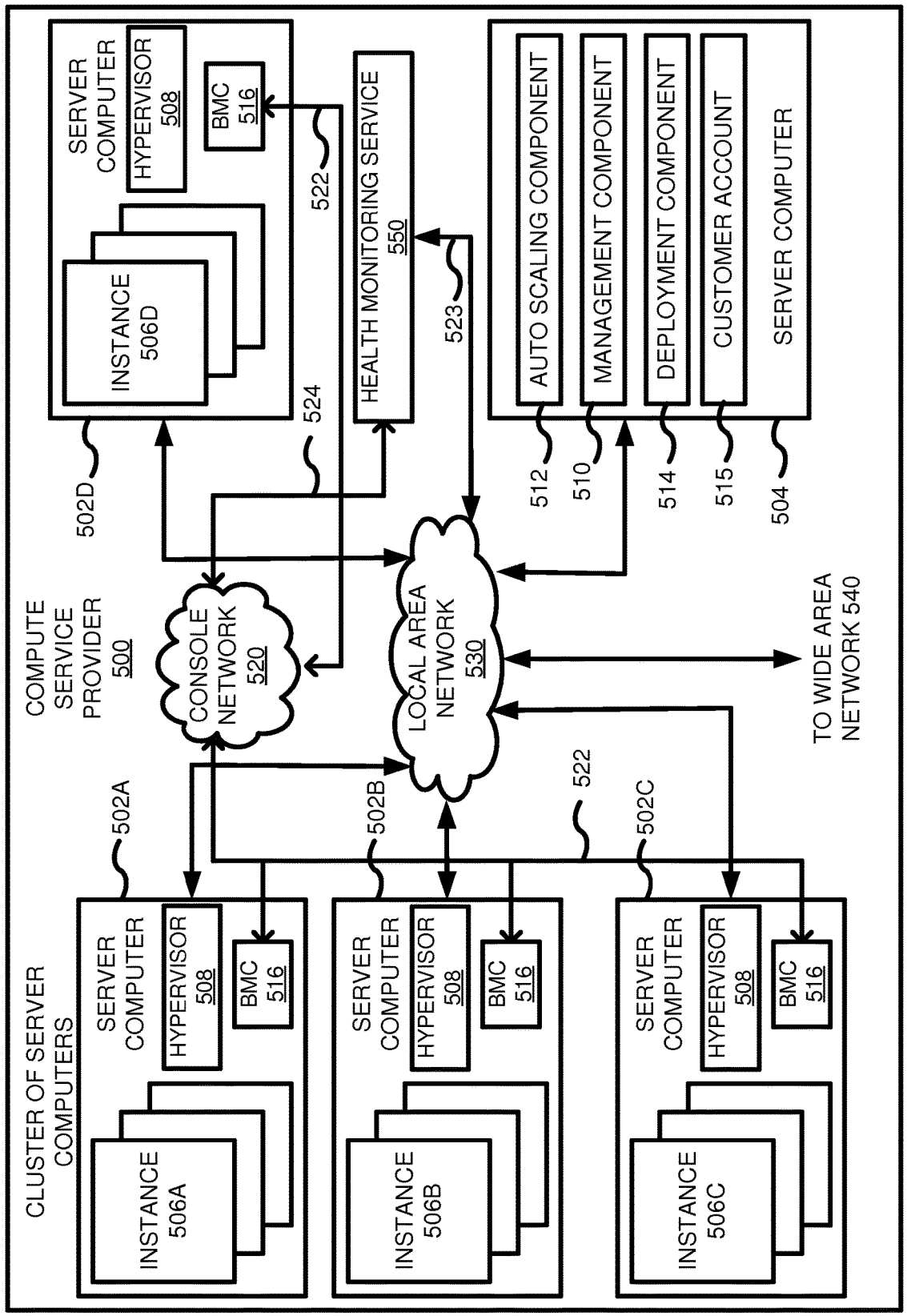
FIG. 5 is a system diagram showing an example of a plurality of virtual machine instances running in a multi-tenant environment.

FIG. 5 is a system diagram showing an example of a plurality of virtual machine instances running in a multi-tenant environment, using a health monitoring service 550. More specifically, FIG. 5 is a computing system diagram of a network-based compute service provider 500 that illustrates one environment in which embodiments described herein can be used. By way of background, the compute service provider 500 (i.e., the cloud provider) is capable of delivery of computing and storage capacity as a service to a community of end recipients.

In an example embodiment, the compute service provider can be established for an organization by or on behalf of the organization. That is, the compute service provider 500 may offer a "private cloud environment." In another embodiment, the compute service provider 500 supports a multi-tenant environment, wherein a plurality of customers operate independently (i.e., a public cloud environment). Generally speaking, the compute service provider 500 can provide the following models: Infrastructure as a Service ("IaaS"), Platform as a Service ("PaaS"), and/or Software as a Service ("SaaS"). Other models can be provided. For the IaaS model, the compute service provider 500 can offer computers as physical or virtual machines and other resources. The virtual machines can be run as guests by a hypervisor, as described further below. The PaaS model delivers a computing platform that can include an operating system, programming language execution environment, database, and web server. Application developers can develop and run their software solutions on the compute service provider platform without the cost of buying and managing the underlying hardware and software. The SaaS model allows installation and operation of application software in the compute service provider. In some embodiments, end users access the compute service provider 500 using networked client devices, such as desktop computers, laptops, tablets, smartphones, etc. running web browsers or other lightweight client applications. Those skilled in the art will recognize that the compute service provider 500 can be described as a "cloud" environment.

The particular illustrated compute service provider 500 includes a plurality of server computers 502A-502D. While only four server computers are shown, any number can be used, and large centers can include thousands of server computers. The server computers 502A-502D can provide computing resources for executing software instances 506A-506D. In one embodiment, the instances 506A-506D are virtual machines. As known in the art, a virtual machine is an instance of a software implementation of a machine (i.e., a computer) that executes applications like a physical machine. In the example, each of the server computers 502A-502D can be configured to execute a hypervisor 508 or another type of program configured to enable the execution of multiple instances 506 on a single server. For example, each of the servers 502A-502D can be configured (e.g., via the hypervisor 508) to support one or more virtual machine partitions, with each virtual machine partition capable of running a virtual machine instance (e.g., server computer 502A could be configured to support three virtual machine partitions each running a corresponding virtual machine instance). Additionally, each of the instances 506 can be configured to execute one or more applications.

In an example embodiment, each of the server computers 502A-502D may also comprise a BMC 516 communicatively coupled to the console network 520 (which may be similar to the console network 456 in FIG. 4). The BMCs 516 may perform functionalities that are similar to the functionalities described herein in reference to the BMC 220 in FIG. 2. Such functionalities may include, for example, dynamically adjusting the refresh rate and/or scrub rate of the server computer memory based on a detected error rate of the memory, as explained in greater detail in reference to FIGS. 1-4.

The compute service provider 500 may also comprise a health monitoring service 550. The health monitoring service 550 may comprise suitable logic, circuitry, interfaces, and/or code and may be operable to communicate with the BMCs 516 using the console network 520 and the communication paths 524 and 522 (which may comprise wired and/or wireless communication links). For example, the health monitoring service 550 may provide a user interface to an administrator for obtaining secure access (e.g., password-protected access) to the console network 520 and to one or more of the BMCs 516. In some implementations, the health monitoring service 550 may be managed via a network 530 and communication path 523. As previously described, each BMC 516 can have an independent IP address separate from an IP address of its associated server computer 502. Additionally, the networks 520 and 530 can be combined. The health monitoring service 550 may be used for monitoring the status of the memory and/or other components of the of the server computers 502A-502D. The health monitoring service 550 may aggregate health information from the individual server computers 502A-502D to determine system-wide health. Based on the analysis of a particular server's or of the system's health, the health monitoring service 550 can issue an alert to a system administrator to repair or analyze one or more components of the system. The health monitoring service 550 may be implemented in a dedicated server (similar to the servers 502A-502D), or may be implemented as part of the server computer 504 that performs management functions. For example, the health monitoring service 550 may be implemented as part of the management component 510.

It should be appreciated that although the embodiments disclosed herein are described primarily in the context of virtual machines, other types of instances can be utilized with the concepts and technologies disclosed herein. For instance, the technologies disclosed herein can be utilized with storage resources, data communications resources, and with other types of computing resources. The embodiments disclosed herein might also execute all or a portion of an application directly on a computer system without utilizing virtual machine instances.

One or more server computers 504 can be reserved for executing software components for managing the operation of the server computers 502 and the instances 506. For example, the server computer 504 can execute a management component 510. A customer can access the management component 510 to configure various aspects of the operation of the instances 506 purchased by the customer. For example, the customer can purchase, rent or lease instances and make changes to the configuration of the instances. The customer can also specify settings regarding how the purchased instances are to be scaled in response to demand. The management component 510 can further include a policy document to implement customer policies. An auto scaling component 512 can scale the instances 506 based upon rules defined by the customer. In one embodiment, the auto scaling component 512 allows a customer to specify scale-up rules for use in determining when new instances should be instantiated and scale-down rules for use in determining when existing instances should be terminated. The auto scaling component 512 can consist of a number of subcomponents executing on different server computers 502 or other computing devices. The auto scaling component 512 can monitor available computing resources over an internal management network and modify resources available based on need.

A deployment component 514 can be used to assist customers in the deployment of new instances 506 of computing resources. The deployment component can have access to account information associated with the instances, such as who is the owner of the account, credit card information, country of the owner, etc. The deployment component 514 can receive a configuration from a customer that includes data describing how new instances 506 should be configured. For example, the configuration can specify one or more applications to be installed in new instances 506, provide scripts and/or other types of code to be executed for configuring new instances 506, provide cache logic specifying how an application cache should be prepared, and other types of information. The deployment component 514 can utilize the customer-provided configuration and cache logic to configure, prime, and launch new instances 506. The configuration, cache logic, and other information may be specified by a customer using the management component 510 or by providing this information directly to the deployment component 514. The instance manager can be considered part of the deployment component.

Customer account information 515 can include any desired information associated with a customer of the multi-tenant environment. For example, the customer account information can include a unique identifier for a customer, a customer address, billing information, licensing information, customization parameters for launching instances, scheduling information, auto-scaling parameters, previous IP addresses used to access the account, and so forth.

A network 530 can be utilized to interconnect the server computers 502A-502D and the server computer 504. The network 530 can be a local area network (LAN) and can be connected to a Wide Area Network (WAN) 540 so that end-users can access the compute service provider 500. Additionally, the BMCs 516 within the server computers 502A-502D and the health monitoring service 550 may be interconnected using the console network 520. The console network 520, as explained herein, is a management network that is restricted for access by end users and may be password-protected, granting access only to authorized operators (e.g., network administrators) of the health monitoring service 550.

It should be appreciated that the network topology illustrated in FIG. 5 has been simplified and that many more networks and networking devices can be utilized to interconnect the various computing systems disclosed herein.

Figure 6:
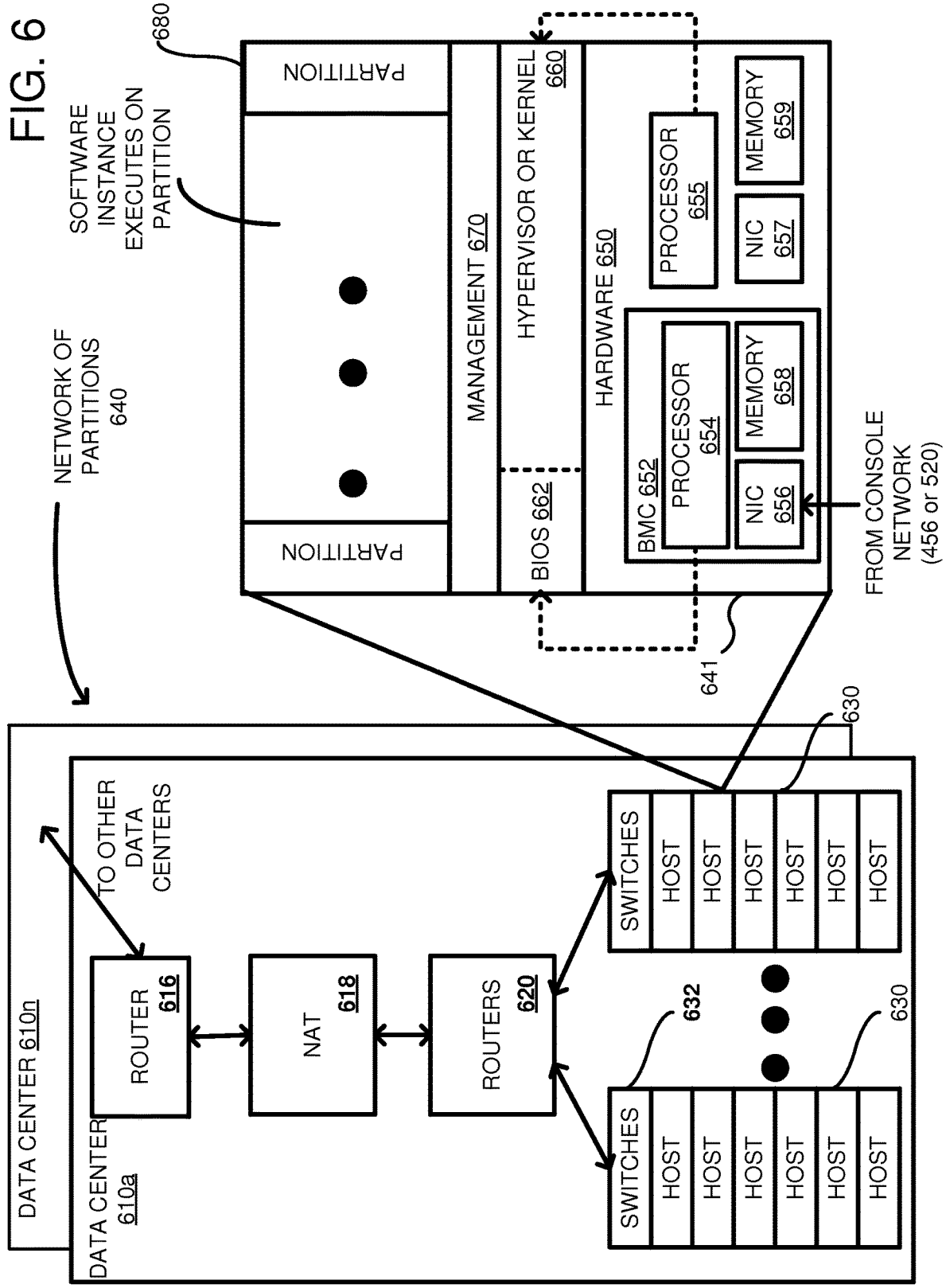
FIG. 6 shows an example of a plurality of host computers, routers and switches, which are hardware assets used for running virtual machine instances.

FIG. 6 shows an example of a plurality of host computers, routers, and switches—which are hardware assets used for running virtual machine instances—with the host computers using a baseboard management controller (BMC) to dynamically adjust a refresh rate and/or a scrub rate based on a calculated error rate, according to one embodiment. More specifically, FIG. 6 illustrates the network of partitions 640 and the physical hardware associated therewith. The network of partitions 640 can include a plurality of data centers, such as data centers 610a, . . . , 610n, coupled together by routers, such as router 616. The router 616 reads address information in a received packet and determines the packet's destination. If the router decides that a different data center contains a host server computer, then the packet is forwarded to that data center. If the packet is addressed to a host in the data center 610a, then it is passed to a network address translator (NAT) 618 that converts the packet's public IP address to a private IP address. The NAT 618 also translates private addresses to public addresses that are bound outside of the data center 610a. Additional routers 620 can be coupled to the NAT 618 to route packets to one or more racks 630 of host server computers. Each rack 630 can include a switch 632 coupled to multiple host server computers. A particular host server computer is shown in an expanded view at 641.

Each host 641 has underlying hardware 650 including one or more CPUs (e.g., processor 655), memory (e.g., memory 659), a network interface card (NIC) 657, storage devices, etc. The hardware layer 650 may implement the hardware elements of the host 641 (e.g., processor 655, NIC 657, and memory 659), as well as a BMC 652 (which may be the same as the BMCs 516 and 420). Each BMC 652 may include a BMC processor 654, memory 658, and a NIC 656, all being part of the hardware layer 650. The BMC NIC 656 may be used for communicating with the console network 520 (or 456).

Running a layer above the hardware 650 is a hypervisor or kernel layer 660 and BIOS 662. The hypervisor or kernel layer 660 can be classified as a type 1 or type 2 hypervisor. A type 1 hypervisor runs directly on the host hardware 650 to control the hardware and to manage the guest operating systems. A type 2 hypervisor runs within a conventional operating system environment. Thus, in a type 2 environment, the hypervisor can be a distinct layer running above the operating system and BIOS 662, and the operating system and BIOS 662 interact with the system hardware. Different types of hypervisors include Xen-based, Hyper-V, ESXi/ESX, Linux, etc., but other hypervisors can be used. A management layer 670 can be part of the hypervisor or separated therefrom and generally includes device drivers needed for accessing the hardware 650. The partitions 680 are logical units of isolation by the hypervisor. Each partition 680 can be allocated its own portion of the hardware layer's memory, CPU allocation, storage, etc. Additionally, each partition can include a virtual machine and its own guest operating system. As such, each partition is an abstract portion of capacity designed to support its own virtual machine independent of the other partitions.

The BMC operating system may be executed by the BMC processor 654 using the BMC memory 658, and may be running above the hardware layer 650, as part of the kernel layer 660. Similarly, the BIOS 662 and an operating system for the host 641 (e.g., a hypervisor) may be executed by the processor 655 using the memory 659, and may also be running above the hardware layer 650.

Any applications executing on the instances can be monitored using the management layer 670, which can then pass the metrics to a health monitoring service (e.g., 458 or 550) for storage in a metrics database. Additionally, the management layer 670 can pass to a monitoring service the number of instances that are running, when they were launched, the operating system being used, the applications being run, etc. All such metrics can be used for consumption by the health monitoring service and stored in a database for subsequent use.

Figure 7:
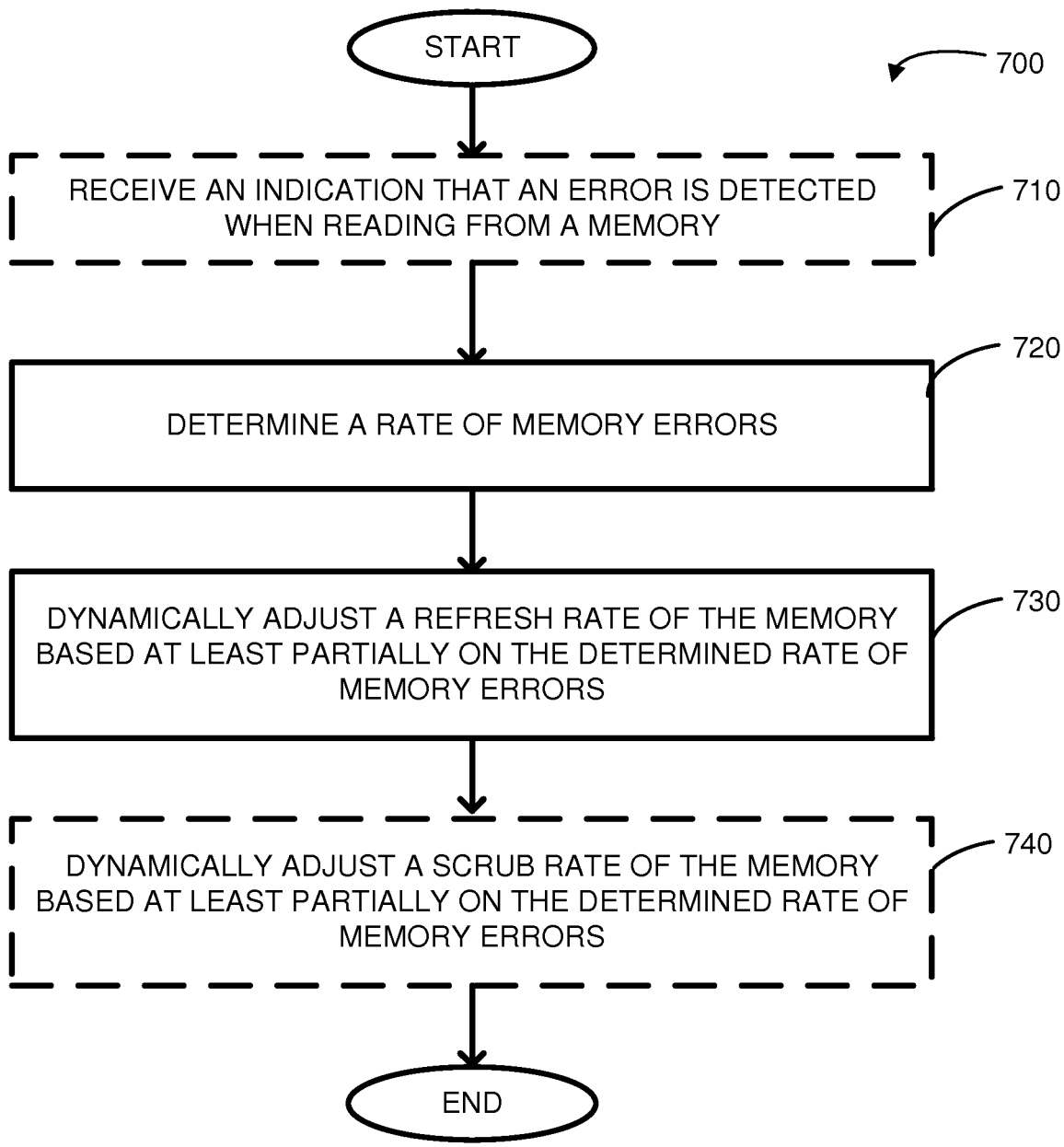
FIG. 7 is a flow diagram of an example method for adjusting the refresh rate based on the error rate of the memory.

FIG. 7 is a flow diagram of an example method 700 for adjusting the refresh rate based on the error rate of the memory. At 710, an indication that an error is detected when reading from the memory can be received. For example, the information to be written to the memory can be protected by encoding the information using a block code (such as a code in the family of Hamming codes) or a convolutional code. Different codes can provide trade-offs between different levels of protection, complexity of decoding, and the amount of storage used for ECC bits. For example, a common code enables single-bit error correction and double-bit error detection. A block code can be used to generate ECC bits to be stored with a word of data in the memory. While the information is stored in the memory, the information may become corrupted when one or more bits of the information and/or ECC bits are flipped. When the information and ECC bits are read from the memory, the information can be checked or verified to determine if the information was corrupted during the writing, storage, or reading of the information. If errors are detected, an indication can be generated to notify control logic of the error. The indication can include the type of error detected, such as a correctable or an uncorrectable error type. The indication can be an assertion of a hardware or software interrupt, for example.

At 720, a rate of memory errors can be determined. The rate of memory errors can be a measure of how many errors are detected in a given amount of time. Multiple error rates can be determined, such as a long-term error rate and a short-term error rate. The error rate can be determined in response to receiving the indication that the error is detected and/or in response to an expiration of a predefined time interval. For example, when the error rate is high, it may be desirable to determine the error rate when an error is detected so that any potential corrective action (such as adjusting the refresh rate) can be taken sooner than waiting until a later time. As another example, when the error rate is low, it may be desirable to determine the error rate periodically (such as once an hour) so that any earlier corrective action can be rolled back sooner than waiting for a rare memory error to occur.

At 730, a refresh rate of the memory can be dynamically adjusted based at least partially on the determined rate of memory errors. Dynamically adjusting the refresh rate can include adjusting the refresh rate while the memory continues to be operational. For example, the refresh rate can be adjusted without re-initializing or modifying contents of the memory. As another example, a processor or other logic accessing the memory can continue to operate during the adjustment without the processor or other logic being re-initialized or rebooted. Adjusting the refresh rate of the memory can include calling a system management interrupt handler routine in response to receiving an interrupt. Adjusting the refresh rate can include writing a control register of a memory controller in communication with the memory.

Dynamically adjusting the refresh rate of the memory can include increasing the refresh rate of the memory when the determined rate of memory errors exceeds a predetermined threshold. Dynamically adjusting the refresh rate of the memory can include decreasing the refresh rate of the memory when the determined rate of errors is less than a predetermined threshold. A default refresh rate can be specified by the manufacturer of the memory. The refresh rate can be increased or decreased in multiples of the default refresh rate (e.g., 1×, 2×, 3×). Alternatively, the refresh rate can be increased or decreased by directly setting a rate or interval for the refresh (e.g., 64 milliseconds, 50 milliseconds, and so forth). The refresh rate can be adjusted based on additional factors, such as a power-state of a system containing the memory or a function of the memory.

At 740, a scrub rate of the memory can be dynamically adjusted based at least partially on the determined rate of memory errors. Dynamically adjusting the scrub rate of the memory can include increasing the scrub rate of the memory when the determined rate of memory errors exceeds a predetermined threshold. Dynamically adjusting the scrub rate of the memory can include decreasing the scrub rate of the memory when the determined rate of memory errors is less than a predetermined threshold. The scrub rate can be adjusted based on additional factors, such as a power-state of a system containing the memory or a function of the memory.

Figure 8:
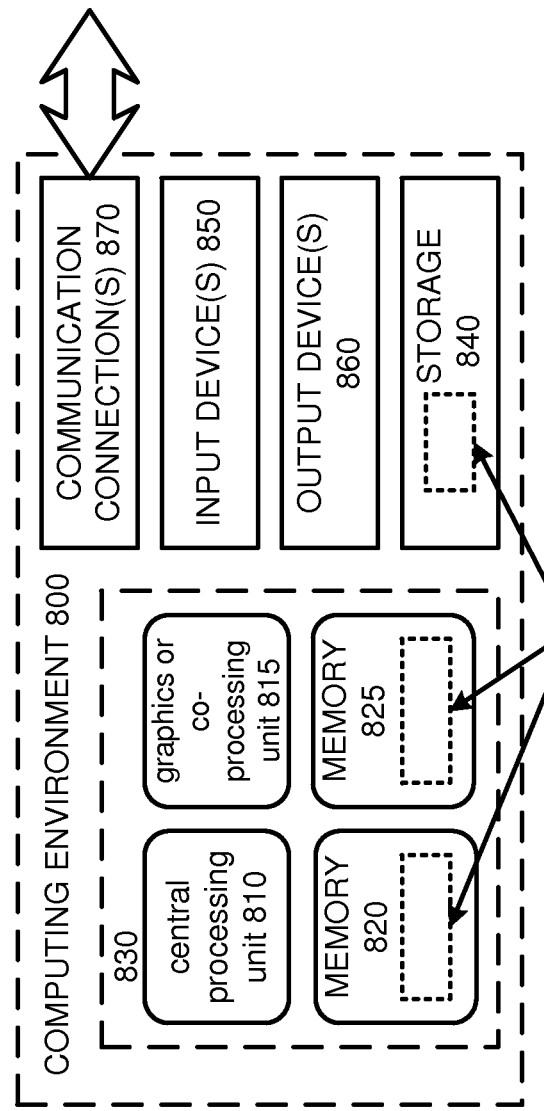
FIG. 8 depicts a generalized example of a suitable computing environment in which the described innovations may be implemented.

FIG. 8 depicts a generalized example of a suitable computing environment 800 in which the described innovations may be implemented. The computing environment 800 is not intended to suggest any limitation as to scope of use or functionality, as the innovations may be implemented in diverse general-purpose or special-purpose computing systems. For example, the computing environment 800 can be any of a variety of computing devices (e.g., desktop computer, laptop computer, server computer, tablet computer, etc.)

With reference to FIG. 8, the computing environment 800 includes one or more processing units 810, 815 and memory 820, 825. In FIG. 8, this basic configuration 830 is included within a dashed line. The processing units 810, 815 execute computer-executable instructions. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 8 shows a central processing unit 810 as well as a graphics processing unit or co-processing unit 815. The tangible memory 820, 825 may be volatile memory (e.g., registers, cache, RAM), non-volatile memory (e.g., ROM, EEPROM, flash memory, etc.), or some combination of the two, accessible by the processing unit(s). The memory 820, 825 stores software 880 implementing one or more innovations described herein, in the form of computer-executable instructions suitable for execution by the processing unit(s).

A computing system may have additional features. For example, the computing environment 800 includes storage 840, one or more input devices 850, one or more output devices 860, and one or more communication connections 870. An interconnection mechanism (not shown) such as a bus, controller, or network interconnects the components of the computing environment 800. Typically, operating system software (not shown) provides an operating environment for other software executing in the computing environment 800, and coordinates activities of the components of the computing environment 800.

The tangible storage 840 may be removable or non-removable, and includes magnetic disks, magnetic tapes or cassettes, CD-ROMs, DVDs, or any other medium which can be used to store information in a non-transitory way and which can be accessed within the computing environment 800. The storage 840 stores instructions for the software 880 implementing one or more innovations described herein.

The input device(s) 850 may be a touch input device such as a keyboard, mouse, pen, or trackball, a voice input device, a scanning device, or another device that provides input to the computing environment 800. The output device(s) 860 may be a display, printer, speaker, CD-writer, or another device that provides output from the computing environment 800.

The communication connection(s) 870 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub-combinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. Therefore, what is claimed as the invention is all that comes within the scope of these claims.

What is claimed is:

1. A method comprising:
   receiving an indication that a correctable error is detected when reading from dynamic random access memory (DRAM) in communication with a processor, the processor being in a fleet of processors;
   using a baseboard management controller in communication with the processor to calculate an error rate of reading from the DRAM and to determine that the error rate exceeds a pre-determined threshold error rate, the baseboard management controller in communication with a health monitoring service configured to monitor the operational status for the fleet of processors;

determining that a refresh rate of the DRAM exceeds a default refresh rate of the DRAM;

without rebooting the processor, using the baseboard management controller to initiate programming of a memory controller to increase both the refresh rate and a patrol scrub rate of the DRAM in response to determining that the error rate exceeds the pre-determined threshold error rate and that the refresh rate of the DRAM exceeds the default refresh rate of the DRAM, wherein the patrol scrub rate is different from the refresh rate;

in response to increasing both the refresh rate and the patrol scrub rate of the DRAM, using the baseboard management controller to transmit a status message, indicating the increase of the refresh rate and the patrol scrub rate, to the health monitoring service that is configured to monitor the operational status for the fleet of processors, the health monitoring service executing on a management server computer; and using the health monitoring service to determine that a denial of service attack is underway on the fleet of processors based on the refresh rate and the patrol scrub rate of the DRAM being increased.

2. The method of claim 1, wherein using the baseboard management controller to initiate programming of a memory controller comprises invoking a system management interrupt handler executing on the processor and in response to receiving the indication that the correctable error is detected.

3. The method of claim 1, further comprising:
without rebooting the processor, decreasing the refresh rate of the DRAM when the calculated error rate is below the pre-determined threshold error rate.

4. A computer-readable storage medium including instructions that upon execution cause a computer system to:
determine a rate of memory errors detected when a first processor reads a memory, the first processor being part of a fleet of processors;
determine that a refresh rate of the memory exceeds a default refresh rate of the memory; and
use a second processor to program a memory controller of the first processor so that both the refresh rate of the memory and a patrol scrub rate of the memory are dynamically adjusted in response to determining that the rate of memory errors exceeds a threshold error rate and that the refresh rate of the memory exceeds a default refresh rate of the memory, wherein the patrol scrub rate is different from the refresh rate; and
use the second processor to send a status message to a third processor, the status message indicating that the refresh rate and the patrol scrub rate are being dynamically adjusted, the third processor executing health monitoring service software configured to monitor the operational status for the fleet of processors;
wherein the health monitoring service software is configured to determine that a denial of service attack is underway on the fleet of processors based on the refresh rate and the patrol scrub rate of the memory being increased at the second processor.

5. The computer-readable storage medium of claim 4, wherein the instructions, upon execution, further cause the computer system to:
receive an indication that a correctable error is detected when reading from the memory, and wherein the rate of memory errors is determined in response to receiving the indication that the correctable error is detected.

6. The computer-readable storage medium of claim 4, wherein the rate of memory errors is determined in response to an expiration of a predefined time interval.

7. The computer-readable storage medium of claim 4, wherein dynamically adjusting the refresh rate of the memory comprises writing data to a control register of the memory controller of the first processor.

8. The computer-readable storage medium of claim 4, wherein dynamically adjusting the refresh rate of the memory comprises increasing the refresh rate of the memory.

9. The computer-readable storage medium of claim 4, wherein dynamically adjusting the refresh rate of the memory comprises decreasing the refresh rate of the memory.

10. The computer-readable storage medium of claim 4, wherein dynamically adjusting the refresh rate of the memory comprises calling a system management interrupt handler routine.

11. A computing system comprising:
a management server computer executing a health monitoring service configured to monitor a status of a fleet of processors;
a processor comprising a memory controller, the processor being one processor of the fleet of processors;
a memory in communication with the processor and configured to store a code word comprising data and error correcting code bits associated with the data;
error detection logic in communication with the processor and the memory, the error detection logic configured to signal an error indicating the code word is corrupted when read from the memory; and
a baseboard management controller in communication with the error detection logic, the processor, and the management server computer, the baseboard management controller executing refresh control logic software configured to:
receive the signal from the error detection logic indicating the code word is corrupted;
calculate a memory error rate of the memory;
determine that a refresh rate of the memory exceeds a default refresh rate of the memory;
dynamically adjust the refresh rate of the memory, in response to determining that the calculated memory error rate exceeds a threshold error rate and that the refresh rate of the memory exceeds the default refresh rate of the memory, by programming the memory controller of the processor; and
transmit a status message to the health monitoring service, the status message indicating that the refresh rate of the memory is being adjusted;
wherein the health monitoring service is configured to determine whether a denial of service attack is underway on the fleet of processors based on the status message, indicating that the refresh rate of the memory was increased.

12. The computing system of claim 11, wherein the refresh control logic software is further configured to calculate the memory error rate in response to receiving the signal from the error detection logic.

13. The computing system of claim 11, wherein the refresh control logic software is further configured to calculate the memory error rate in response to an expiration of a predefined time interval.

14. The computing system of claim 11, wherein dynamically adjusting the refresh rate of the memory comprises increasing the refresh rate of the memory.

15. The computing system of claim 11, wherein dynamically adjusting the refresh rate of the memory comprises decreasing the refresh rate of the memory.

16. The computing system of claim 11, wherein transmitting the status message indicating when the refresh rate of the memory is adjusted comprises sending a Simple Network Management Protocol message to the management server over a console network that is connected to the baseboard management controller and not the processor.

17. The method of claim 1, wherein the status message comprises a Simple Network Management Protocol message.

* * * * *